(12) United States Patent
Brueske et al.

(10) Patent No.: US 6,670,901 B2
(45) Date of Patent: Dec. 30, 2003

(54) DYNAMIC RANGE ON DEMAND RECEIVER AND METHOD OF VARYING SAME

(75) Inventors: Daniel E. Brueske, Plantation, FL (US); Babak Bastani, Tournefeuille (FR)

(73) Assignee: Motorola, Inc., Schaumburg, IL (US)

( * ) Notice: Subject to any disclaimer, the term of this patent is extended or adjusted under 35 U.S.C. 154(b) by 367 days.

(21) Appl. No.: 09/919,554

(22) Filed: Jul. 31, 2001

(65) Prior Publication Data

US 2003/0025623 A1 Feb. 6, 2003

(51) Int. Cl.[7] .................................................. H03M 1/62
(52) U.S. Cl. ..................... 341/139; 341/143; 455/232.1; 375/316
(58) Field of Search ................................. 341/139, 143; 329/304; 342/95; 370/355; 375/130; 380/34; 455/234.2

(56) References Cited

U.S. PATENT DOCUMENTS

| | | | | |
|---|---|---|---|---|
| 4,646,097 A | * | 2/1987 | King ............................ | 342/95 |
| 4,956,864 A | * | 9/1990 | Brockman .................... | 380/34 |
| 5,708,658 A | * | 1/1998 | Sugita ......................... | 370/355 |
| 5,742,899 A | * | 4/1998 | Blackburn et al. ........ | 455/234.2 |
| 6,005,506 A | * | 12/1999 | Bazarjani et al. ........... | 341/143 |
| 6,075,409 A | * | 6/2000 | Khlat .......................... | 329/304 |
| 2001/0055328 A1 | * | 12/2001 | Dowling ..................... | 375/130 |

* cited by examiner

Primary Examiner—Michael Tokar
Assistant Examiner—John Nguyen
(74) Attorney, Agent, or Firm—Miller, Johnson, Snell & Cummiskey, P.L.C.

(57) ABSTRACT

A dynamic range on demand radio frequency (RF) receiver (300) includes a wideband detector (303), off-channel detector (313) and on-channel detector (327) supplying input to an automatic gain control (307) for adjusting a dynamic control stage to control dynamic range and resolution of digital baseband signals (329, 331).

19 Claims, 2 Drawing Sheets

DYNAMIC RANGE ON DEMAND RECEIVER AND METHOD OF VARYING SAME

TECHNICAL FIELD

This invention relates in general to radio frequency (RF) receivers and more particularly to control of receiver dynamic range.

BACKGROUND

With the increasing demand for multi-mode/multi-band wireless products, there is a need for cost effective architectures such as direct conversion radio frequency (RF) receivers. The use of a dynamic range on demand direct conversion architecture (this invention) provides a high performance receiver with long battery life, reduced parts count and shortened manufacturing time. In the past, many electronic devices using other architectures have had a reduced battery life, increased battery size and/or cost due to the required use of more complex battery chemistries. By way of example, the conventional direct conversion code division multiple-access (CDMA) receiver requires approximately twice as much current drain in the RF to analog-to-digital (A/D) line up which has a major impact on the receive mode current drain.

With regard to CDMA, increased competition in the wireless market has driven receiver topology designs to their most cost effective solutions. These new architectures typically make the system less complex and cross platform. This cost savings has resulted in the removal of passive selectivity such as surface acoustic wave (SAW) or crystal filters to reduce cost and a broadening of the analog-to-digital (A/D) converter specifications to meet the multi-MA (Multi Access) requirements. Active integrated circuits provide a cost effective method in which to implement these new architectures.

Currently there are no new methods in which to implement a passive highly selective or high quality factor (Q) filter onto an integrated circuit silicon based process. Thus, for a given integrated circuit process, the current drain will increase as any new receiver designs remove off chip passive selectivity. When large signals are present and no passive selectivity is used to protect the active circuitry, the active circuits will have to operate when weak and very strong signals exist simultaneously. With passive selectively, large alternate signals are attenuated before the active circuitry, thus reducing its strength at the active circuits. New cost effective architectures with integrated circuit solutions will thus have to handle a larger range of signals.

Prior art FIG. 1 shows an exiting receiver zero intermediate frequency (ZIF) architecture 100 for a CDMA handset. As is known in the art, the 3 dB low-pass bandwidth of the CDMA signal is approximately 620 KHz. Due to the fact that the IS-95 CDMA standard has to co-exist with AMPS standard signals in the same frequency band, this type of receiver has to tolerate an AMPS interferer that is approximately 74 dB higher than the CDMA signal at 900 KHz away from the center of the carrier. The receiver shown in FIG. 1 passes an incoming RF signal through an adjustable low noise amplifier (LNA) 103 into an RF saw filter 105. The input signal is than fed though a down conversion mixer 107 onto an IF SAW filter 109 providing approximately 30 dB of attenuation at 900 KHz. As typical with a ZIF receiver architecture, the signals then are split into I-Q components by mixing them using ZIF mixers 111,113 and local oscillator 115. This architecture relaxes the dynamic range requirements of the baseband filters 119,121 and the A/D converters 123,125 to the extent that 7-pole filters are used and there is only a need for a 6 bit A/D converter 123,125 in the I-Q signal chain.

The direct conversion receiver architecture shown in prior art FIG. 2 has demonstrated one viable solution in reducing cost and part count. In this architecture, no IF SAW filter is used. Thus, in order to provide the protection of IM distortion, 9-pole baseband filters 201,203 are used along with higher resolution A/D converters 205,207. The drawback of this architecture is a high current drain. In systems in which the received signal is slotted, such as GSM, the current can be reduced through duty cycles in a "battery save" mode.

For example, if the current drain is approximately 100 milliamps (mA) during the active cycle and approximately zero mA for battery save cycles, the receiver is only in an "on" mode only $\frac{1}{10}^{th}$ of the talk time. Thus, the average total current drain is 10 mA i.e. (100 mA/10). This duty cycle technique cannot be used for most protocols and hence the current drain (100 mA) would be unacceptable. In further 3GPP systems, such as wide band CDMA (WCDMA), the receiver circuitry is kept active during the entire receive time. Existing land mobile radio analog frequency modulation (FM) systems operate continuously as well.

It is desirable to increase system linearity in the presence of strong on or off channel signals in order to avoid creating intermodulation (IM) products in the desired signal passband. Typically, system linearity can be improved by reducing gain before reaching the IM limiting stages. For some systems, it is desirable to use an amplifier with continuously variable gain to optimize the required gain reduction. At best, many of these continuously variable gain amplifiers have constant third order intercept (IM3) over their gain control range, and at the worst, the third order intercept degrades with increasing attenuation.

The gain controllable amplifiers are usually placed near the front of the radio frequency (RF) or intermediate frequency (IF) string in the receiver thus allowing for system intermediation improvements when gain is decreased. For large signals that require large amounts of gain reduction, the adjustable gain amplifier often becomes the limiting factor for receivers IM performance. In these circumstances, the designer of the stage would need to design an amplifier with sufficient current drain to give the IM performance required for strong signal conditions. This results in excess current drain for weak signal conditions when high linearity is not as important.

Hence, multi-mode receivers which can receive multiple types of MA's will require A/D converters with a large dynamic range. Integrating active selectivity becomes increasingly difficult and consumes more current drain for multi-mode radios. With less active selectivity before the A/D, the dynamic range requirements increase. This, substantial increases in current are needed to maintain multi-mode receiver capabilities. One architecture that is being proposed for next generation CDMA and WCDMA standards is the direct conversion receiver. The IS-95 CDMA system standard is used to quantify the increase in the current drain of the direct conversion receiver compared to a dual conversion receiver.

Thus, the needs exists to provide a low noise amplifier and mixer system topology such that a decreased amount of dynamic range is required by the LNA plus mixer thereby requiring a lesser amount of current drain. This would have an overall effect of providing a more efficient amplifier plus mixer chain capable of handling a wide range of signal levels with relatively small current drain when integrated into a receiver integrated circuit (IC) package.

DETAILED DESCRIPTION OF THE PREFERRED EMBODIMENT

The system of the present invention provides a reduced cost and parts count while also providing a new direct conversion architecture. The present invention deemed dynamic range on demand receiver (DRDR) uses the incoming signals to adjust the dynamic range requirements of the receiver. The receiver constantly updates the dynamic range requirements of a dynamic control stage using active feed forward and feedback signal level detectors. The invention allows the RF amplifier and mixer bias current to be set lower for signal conditions in which little or no gain reduction is needed (weak signals) through AGC detection control circuitry. This allows for enhanced linearity performance with an associated current drain penalty only when the enhanced performance is needed. This allows then for potential current drain savings without sacrificing linearity performance. The proposed invention functions within a radio frequency (RF) receiver as a low noise amplifier variable gain (LNA/VGA) and down conversion mixer typically implemented as a stage in intermediate frequency (IF) or direct conversion receiver (DCR). Wideband, off-channel and on-channel detectors are used to give maximum flexibility to the AGC system. The wideband detector will have a very fast response and should be able to react to fast blockers. With the addition of hysteresis, the A/D dynamic range can be controlled without any degradation to BER and sensitivity.

Figure 1:
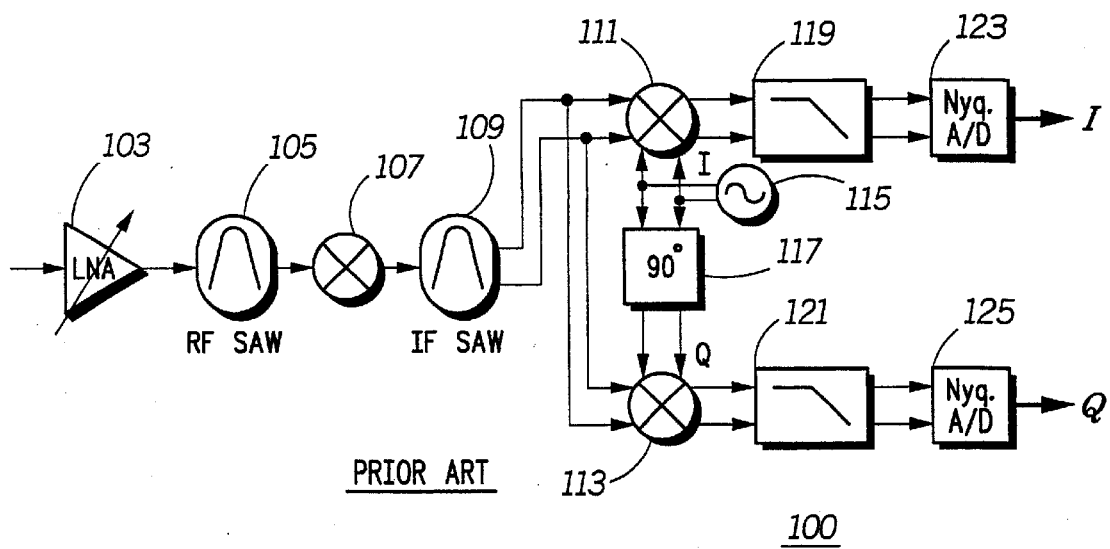
FIG. 1 is a prior art block diagram showing a standard zero intermediate frequency receiver topology.
Figure 2:
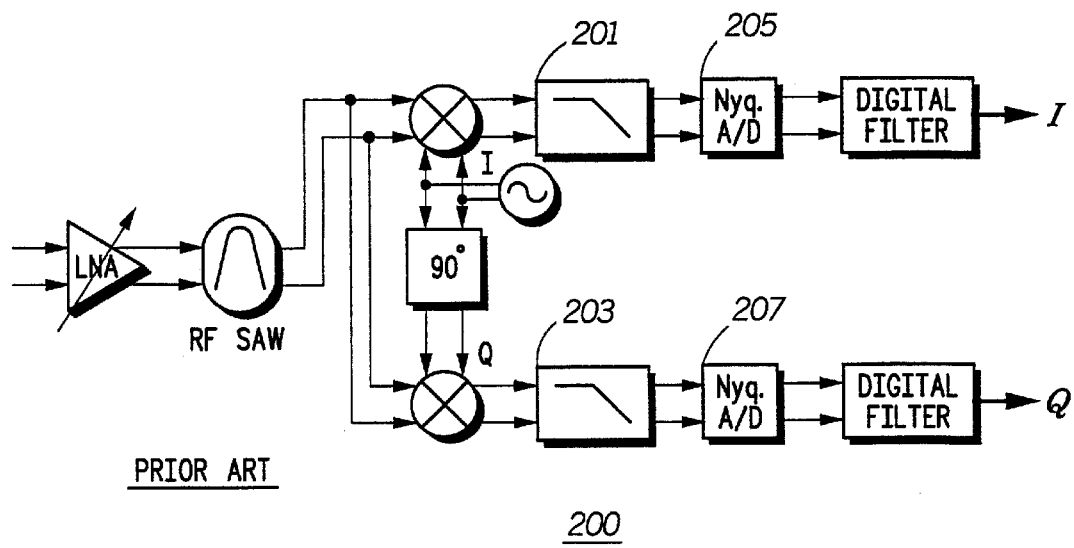
FIG. 2 is a prior art block diagram showing a zero intermediate frequency topology without an IF filter and more selective channel filtering and increased digital to analog converter resolution.
Figure 3:
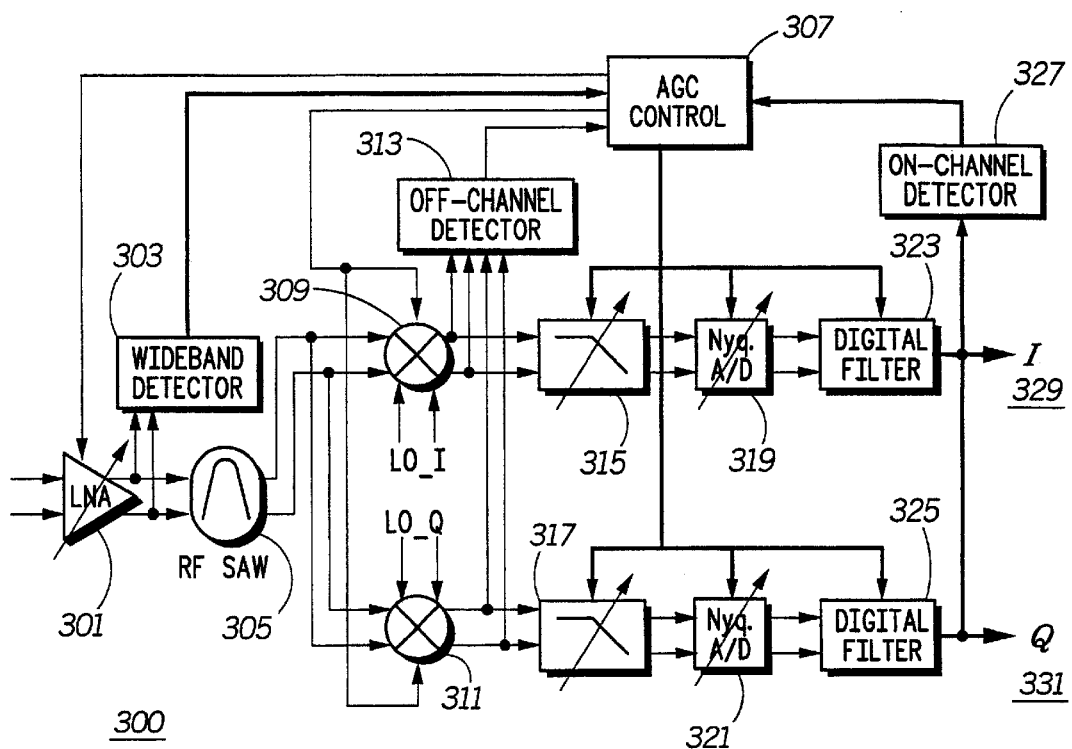
FIG. 3 is a block diagram showing the dynamic range on demand receiver in accordance with the preferred embodiment of the invention.

As seen in FIG. 3, a radio frequency (RF) signal is input to a variable low noise amplifier (LNA) 301. The RF signal is amplified and directed to both a wideband detector 303 and an RF surface acoustic wave (SAW) filter 305. The wideband detector 303 works to detect the presence of wideband on or off channel RF signals such as a code division multiple access (CDMA) signal. The output of the wideband detector 303 is used as an input control signal to the automatic gain control (AGC) 307. As noted above, and is well known in the art, the RF SAW filter 305 works to remove unwanted input signal components.

The output of the RF SAW filter 305 is directed to in-phase (I) and quadrature (Q) channel baseband mixers 309, 311. Both the I channel mixer 309 and the Q channel mixer 311 are mixed with a local oscillator signal to provide direct version zero intermediate frequency (ZIF) receiver. Although shown here as a ZIF receiver, it will be evident to those skilled in the art that the invention as discussed herein may also to apply to multiple IF receiver architectures as well.

The output of the I and Q channel mixers 309, 311 are directed to both a variable dynamic range filters 315, 317 respectively and to an off channel detector 313. The off-channel detector works to detect the presence of strong interfering off-channel RF signals. The output of the off-channel detector is directed to the AGC control 307 where its information is used for AGC control. As is well known the art, the gain of the amplifier or mixer (y) can be represented by the equation: $y = xa1 + 2a2 + x3a3+$ where x represents the input signal and the coefficients a2,a3 represent non-linear components that optimally should equal zero if the stage where to have an infinite dynamic range. Although typically not the case, this would be the case where $y=xa1$ and the stage would be entirely linear. Generally the non-linear coefficients are determined by current bias.

In order to control linearity of the LNA and mixer, the non-linear coefficients a2 and a3 are dynamically adjusted though the bias current. It will be evident to those skilled in the art that precisely how a2 and a3 vary with bias current. Through accurate modeling this can be done through SPICE simulations which can then be used to determine mapping between desired linearity performance and current drain.

An I channel analog filter 315 and Q channel analog filter 317 are both variable dynamic range filters controlled by the AGC control 307. Both filters typically might be 9-pole filters and are used to variably control the dynamic range of each channel based upon control input from an on-channel detector 327 and off channel detector 313. Dynamic bias adjustment is accomplished though an AGC signal that is proportional to the input signal strength in decibels (dB). The AGC signal provided by the AGC control 307 would be used by a bias controller (not shown) to provide a dynamically controlled input bias to the LNA 301 and mixers 309, 311. Thus, dynamic bias control would be accomplished by monitoring the wideband detector 303, off-channel detector 313 and on-channel detector 327 while using a unique bias control to adjust control current to the LNA 301 and mixers 309, 311.

The output of the I channel filter 315 and Q channel filter 317 are then directed to a variable resolution analog-to-digital (A/D) converters 319, 321 respectively. The A/D converter 319 and 321 is typically a 6 to 10 bit converter used for controlling the dynamic resolution of the digital signal. A dynamic bias adjustment of the A/D converter 319, 321 is also controlled through the use of AGC control 307.

In one embodiment of the invention, the A/D architecture might be implemented in a pipeline type architecture. This architecture would be very suitable for the proposed receiver, since there exists a pipeline stage for every bit of an A/D converter. This would lend itself well enabling components to be "shut-off" (or reduce the stage current) to the various least significant bits (LSB's) of the converter based on any interfering signal's amplitude.

In this embodiment, each bit of the A/D converter would be obtained from a separate stage (independent of other stages). As long as the response time of the A/D converter and the wideband detector are faster than the baseband filter delay, the LSB's can be successfully turned on and off to control dynamic range and reduce current drain. In order to speed up the response time of the A/D converter, small amounts of current can be maintained in a switched capacitor stage (not shown) to keep the capacitors charged.

The output of the A/D converters 319, 321 are then directed to digital filters 323, 323. Both I digital filter 323 and Q digital filter 325 are used to control the desired digital frequency response of both I output channel 329 and the Q output channel 331 to further attenuate channel interference.

The current consumption of the digital filter 323, 325 can also be controlled by the AGC control 307 based on the amount of receiver dynamic range that is required due to potentially interfering on or off channel interfering signals. The digital filter current drain can also be reduced due to the reduction in switched activity of each A/D's 319, 321 least significant bits. This technique can easily be implemented to guarantee reduction in overall power consumption.

In sum, the present invention utilizes a receiver topology where an IF SAW filter is removed to achieve a higher degree of dynamic range with lower noise and higher order baseband filters. In addition, the A/D converter dynamic range has been increased in order to be able to tolerate high degrees of on-channel and off-channel interference. The channel interference is further attenuated by the digital filters. As a result of the increased dynamic range in the baseband filers and A/D converters, the current drain of the receiver line-up controlled through the use of a dynamic bias using an AGC control based on input from a wideband detector, on-channel detector and off-channel detector. Thus, the present invention is a great savings in current drain through dynamic bias adjustment with reduced parts count.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A dynamic range on demand radio frequency (RF) receiver comprising:
   an off-channel detector for detecting interference from off-channel RF signals;
   an on-channel detector for detecting the signal strength from on-channel RF signals;
   an wideband detector for detecting the presence of wideband RF signals; and
   an automatic gain control (AGC) for controlling at least one dynamic control stage based on input from the off-channel detector, on-channel detector and wideband detector wherein the dynamic control state comprises at least one variable dynamic range filter for controlling dynamic range of a baseband signal and current drain of the RF receiver.

2. A dynamic range on demand RF receiver as in claim 1, further wherein:
   the dynamic control stage comprises at least one variable resolution analog-to-digital (A/D) converter for controlling dynamic resolution of a baseband signal.

3. A dynamic range on demand RF receiver as in claim 1, further wherein:
   the dynamic control stage comprises at least one digital filter for controlling baseband signal frequency response characteristics.

4. A dynamic range on demand RF receiver as in claim 1, further wherein:
   the AGC further controls at least one low noise amplifier (LNA) used for receiving an input signal to the receiver.

5. A dynamic range on demand RF receiver as in claim 1, further wherein:
   the receiver is a zero intermediate frequency (ZIF) receiver architecture.

6. A radio frequency (RF) receiver for providing changes in dynamic range on demand comprising:
   a low noise amplifier for receiving RF input signals;
   a wideband detector for detecting the presence of wideband RF signals;
   an off channel detector for detecting the presence of off-channel RF interference;
   an on-channel detector for detecting the signal strength of on-channel RF signal;
   at least one dynamic control stage for receiving input from at least one mixer for varying the dynamic range and resolution of at least one baseband signal; and
   an automatic gain control (AGC) for controlling the at least one dynamic control stage based on input signals from the wideband detector, off-channel detector and on-channel detector wherein the at least one dynamic control stage includes at least one analog filter for varying dynamic range of a baseband signal to control current drain of the RF receiver.

7. An RF receiver as in claim 6, wherein the at least one dynamic control stage includes at least one variable resolution analog-to-digital converter for varying dynamic resolution of a baseband signal.

8. An RF receiver as in claim 6, wherein at least one dynamic control stage includes at least one digital filter for controlling the frequency response of a digital baseband signal.

9. An RF receiver as in claim 6, wherein the AGC further controls the gain of the LNA.

10. An RF receiver as in claim 6, further comprising an RF surface acoustic wave filter (SAW) for filtering signals from the LNA.

11. An RF receiver as in claim 6, wherein the wideband detector receives an input from the LNA.

12. An RF receiver as in claim 6, wherein the off-channel detector receives an input from at least one mixer.

13. An RF receiver as in claim 6, wherein the on-channel detector receives an input from at least one digital filter.

14. An RF receiver as in claim 6, wherein the receiver has a zero intermediate frequency (ZIF) architecture.

15. A method for varying the dynamic range of a radio frequency (RF) receiver comprising the steps of:
   providing an RF input signal;
   detecting the presence of wideband RF signals;
   detecting the presence of off-channel interference RF signals;
   detecting the presence of on-channel interfering RF signals;
   controlling the gain of at least one dynamic control stage based on the presence of wideband RF signals, interfering off-channel RF signals and interfering on-channel RF signals; and
   controlling the dynamic range of a baseband signal using at least one variable dynamic range filter to control current drain of the RF receiver.

16. A method for varying the dynamic range of an RF receiver as in claim 15 wherein the setup of controlling further includes the step of:
   controlling the dynamic resolution of a baseband signal using a variable analog-to-digital (A/D) converter.

17. A method for varying the dynamic range of an RF receiver as in claim 15 wherein the step of controlling further includes the step of:

controlling the dynamic range and power consumption of a digital baseband signal using at least one digital filter.

18. A method for varying the dynamic range of an RF receiver as in claim 15 further including the step of:

controlling the gain and bias current of at least one low noise amplifier (LNA) based on the presence of an on-channel detector.

19. A method for varying the dynamic range of an RF receiver as in claim 15 wherein:

the receiver is a zero intermediate frequency (ZIF) receiver architecture.

* * * * *

UNITED STATES PATENT AND TRADEMARK OFFICE
CERTIFICATE OF CORRECTION

PATENT NO. : 6,670,901 B2
DATED : December 30, 2003
INVENTOR(S) : Brueske et al.

It is certified that error appears in the above-identified patent and that said Letters Patent is hereby corrected as shown below:

Column 2,
Line 55, "This" should read -- Thus --

Column 3,
Line 67, delete "a"

Column 4,
Line 10, "where" should read -- were --
Lines 17 and 28, "though" should read -- through --
Lines 17-18, sentence beginning with "It" and ending with "current" should read
-- It will be evident to those skilled in the art precisely how a2 and a3 vary t bias current. --
Line 39, delete "a"
Line 64, "323" (first occurrence) should read -- 325 --

Column 5,
Line 17, "filers" should read -- filters --
Line 43, "an" should read -- a --

Signed and Sealed this

Twenty-second Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,670,901 B2
DATED : December 30, 2003
INVENTOR(S) : Brueske et al.

It is certified that error appears in the above-identified patent and that said Letters Patent is hereby corrected as shown below:

Column 2,
Line 55, "This" should read -- Thus --

Column 3,
Line 67, delete "a"

Column 4,
Line 10, "where" should read -- were --
Lines 17 and 28, "though" should read -- through --
Lines 17-18, sentence beginning with "It" and ending with "current" should read -- It will be evident to those skilled in the art precisely how a2 and a3 vary the bias current. --
Line 39, delete "a"
Line 64, "323" (first occurrence) should read -- 325 --

Column 5,
Line 17, "filers" should read -- filters --
Line 43, "an" should read -- a --

This certificate supersedes Certificate of Correction issued June 22, 2004.

Signed and Sealed this

Tenth Day of August, 2004

JON W. DUDAS
*Acting Director of the United States Patent and Trademark Office*